(12) United States Patent
Park et al.

(10) Patent No.: US 6,870,780 B2
(45) Date of Patent: Mar. 22, 2005

(54) SEMICONDUCTOR MEMORY DEVICE HAVING IMPROVED REDUNDANCY SCHEME

(75) Inventors: Duk-ha Park, Suwon (KR); Hi-choon Lee, Yongin (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/610,953

(22) Filed: Jul. 1, 2003

(65) Prior Publication Data

US 2004/0047222 A1 Mar. 11, 2004

(30) Foreign Application Priority Data

Sep. 9, 2002 (KR) ................................. 10-2002-0054257

(51) Int. Cl.[7] ................................................ G11C 7/00
(52) U.S. Cl. ........................................ 365/200; 365/51
(58) Field of Search ..................... 365/200, 51, 230.03, 365/185.09

(56) References Cited

U.S. PATENT DOCUMENTS 5,831,914 A * 11/1998 Kirihata ..................... 365/200
6,343,306 B1 * 1/2002 Lo .............................. 708/700

FOREIGN PATENT DOCUMENTS

| KR | 1999-001473 | 1/1999 | .......... H01L/27/10 |
| KR | 01-69203 | 7/2001 | .......... G11C/16/06 |

* cited by examiner

Primary Examiner—Tan T. Nguyen
(74) Attorney, Agent, or Firm—Mills & Onello, LLP

(57) ABSTRACT

A semiconductor memory device with an improved redundancy scheme is provided. The semiconductor memory device includes at least one memory block having a plurality of memory banks that are arranged in a column direction. Each memory bank includes a plurality of normal memory cells, which are arranged according to a row and column structure, and at least one redundancy memory cell to replace defective memory cells. At least one memory bank, adjacent to an edge of photo shot or an edge of chip, among the plurality of memory banks includes more redundancy lines than the other memory banks. In the semiconductor memory device, when memory banks have different numbers of defective memory cells to be repaired, the number of redundancy memory cells of each memory bank is differently set, thus increasing the yield.

10 Claims, 3 Drawing Sheets

SEMICONDUCTOR MEMORY DEVICE HAVING IMPROVED REDUNDANCY SCHEME

BACKGROUND OF THE INVENTION

This application claims the priority of Korean Patent Application No. 2002-54257, filed Sep. 9, 2002 in the Korean Intellectual Property Office (KIPO), which is incorporated herein in its entirety by reference.

1. Field of the Invention

The present invention relates to a semiconductor memory device, and more particularly, to a method of increasing efficiency of redundancy repair of a semiconductor memory device having a plurality of memory banks.

2. Description of the Related Art

In general, several redundancy memory cells are included in each memory bank in a semiconductor memory device with a multi-bank structure in which a plurality of memory banks are arranged. Defective memory cells are repaired in units of memory banks. That is, when a defective memory cell is included in a memory bank, this cell is replaced with a redundancy memory cell in the memory bank. However, if no redundancy memory cell is present in the memory bank, the defective memory cell cannot be repaired.

In a conventional semiconductor memory device, the respective memory banks include redundancy memory cells of the same numbers.

FIG. 1 is a diagram of an example of a semiconductor wafer in which a plurality of semiconductor memory devices 100 with conventional redundancy schemes are aligned. In general, a semiconductor wafer consists of a plurality of semiconductor memory devices 100. In FIG. 1, the semiconductor wafer is illustrated to have four semiconductor memory devices 100.

It is assumed that the semiconductor wafer of FIG. 1 uses four die masks per photo shot, i.e., a photo shot process is performed on the semiconductor wafer in units of four semiconductor memory devices. In the photo shot process, a semiconductor wafer, which is coated with a photo resist, is covered with a photo mask of a designed circuit pattern, and exposure and development processes are performed on the semiconductor wafer using a photographic imaging apparatus.

Each semiconductor memory device 100 includes a plurality of memory blocks 110 and each memory block 110 includes sixteen memory banks. Although not illustrated in detail, each memory bank has normal memory cells, and a redundancy memory cell. When a normal memory cell has defects, this cell is replaced with a redundant memory cell.

The conventional semiconductor memory device 100 is designed to have the same redundancy scheme in each memory bank 110, so that the number of redundant memory cells, redundant rows, or redundant columns is set to be the same in each memory bank 110. However, repair rate of defective memory cells in a memory bank at an edge portion of a photo shot is higher because a photo margin is insufficient in the photo shot process.

In a conventional redundancy scheme in which each memory bank has redundant memory cells of the same numbers, defective memory cells cannot be effectively repaired in the case where the number of defective memory cells included in each memory bank is different in manufacture of a semiconductor wafer. For instance, many redundant memory cells in a memory bank having less defective memory cells are left after the repair of the defective memory cells, whereas redundant memory cells in a memory bank having more defective memory cells are not ample for the repair of the defective memory cells and many defective memory cells are not repaired.

Referring to FIG. 1, a photo shot process is performed on the semiconductor wafer of FIG. 1 in units of four semiconductor memory devices. During the photo shot process, a rate of defective memory cells in memory banks 130 at edges of a photo shot is higher, thereby reducing yield, that is, the ratio of good-quality semiconductor memory devices with respect to the overall semiconductor memory device. However, if the number of redundant memory cells of each memory bank is increased in order to raise the yield, the size of a semiconductor chip is increased.

SUMMARY OF THE INVENTION

The present invention provides a semiconductor memory device having a plurality of memory banks, in which a total number of redundant memory cells included in the memory banks is different, in general, thus increasing efficiency of redundant repair.

According to one aspect of the present invention, there is provided a semiconductor memory device with an improved redundancy scheme, including a plurality of normal memory cells being arranged according to a row and column matrix structure; and a plurality of memory banks including at least one redundancy line to be used to replace a defective line. The defective line is replaced with a redundancy line of a memory bank to which the defective line belongs, and the number of the redundancy line is set to be different according to the position of a memory bank including the redundancy line.

It is preferable that at least one memory bank, adjacent to an edge of a photo shot, among the memory banks includes M redundancy lines and each of the other memory banks includes N redundancy lines, wherein N is a natural number more than 1, and M is a natural number that is larger than N.

According to another aspect of the present invention, there is provided a semiconductor memory device with an improved redundancy scheme, including a plurality of normal memory cells that are arranged according to a row and column structure; a plurality of memory banks including at least one redundancy line to be used to replace a defective memory cell and being arranged in the column direction; and at least one memory block including the plurality of memory banks. At least one memory bank, adjacent to an edge, among the plurality of memory banks includes more redundancy lines than the other memory banks.

It is preferable that the edge indicates one of an edge of a photo shot and an edge of a chip, and at least one memory bank, adjacent to the edge of a photo shot or a chip, among the plurality of memory banks includes M redundancy lines and the other memory banks include N redundancy lines, wherein N is a natural number more than 1 and M is a natural number that is larger than N.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

Figure 1:
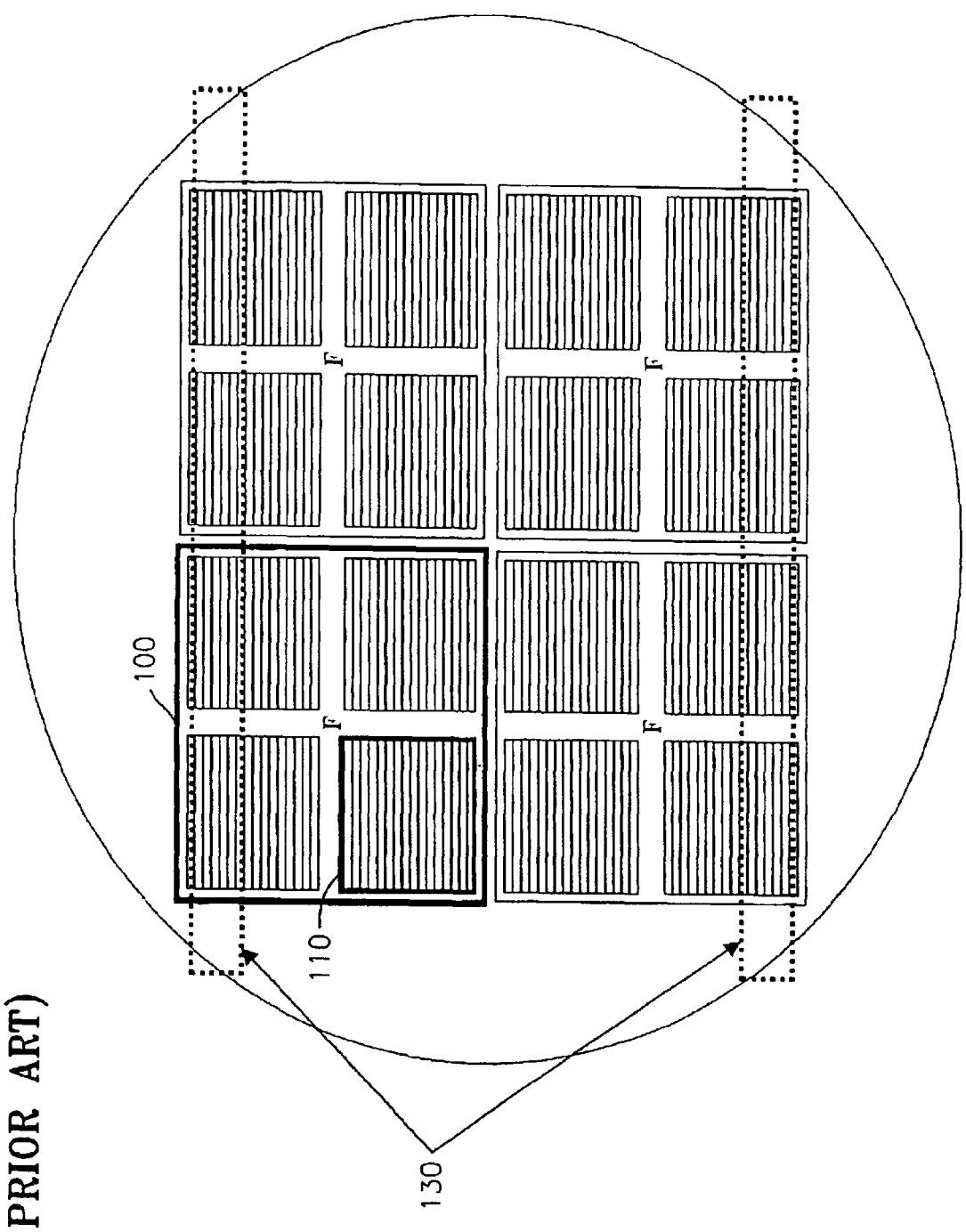
FIG. 1 is a diagram illustrating a semiconductor wafer in which a plurality of semiconductor memory devices having conventional redundancy schemes are aligned.
Figure 2:
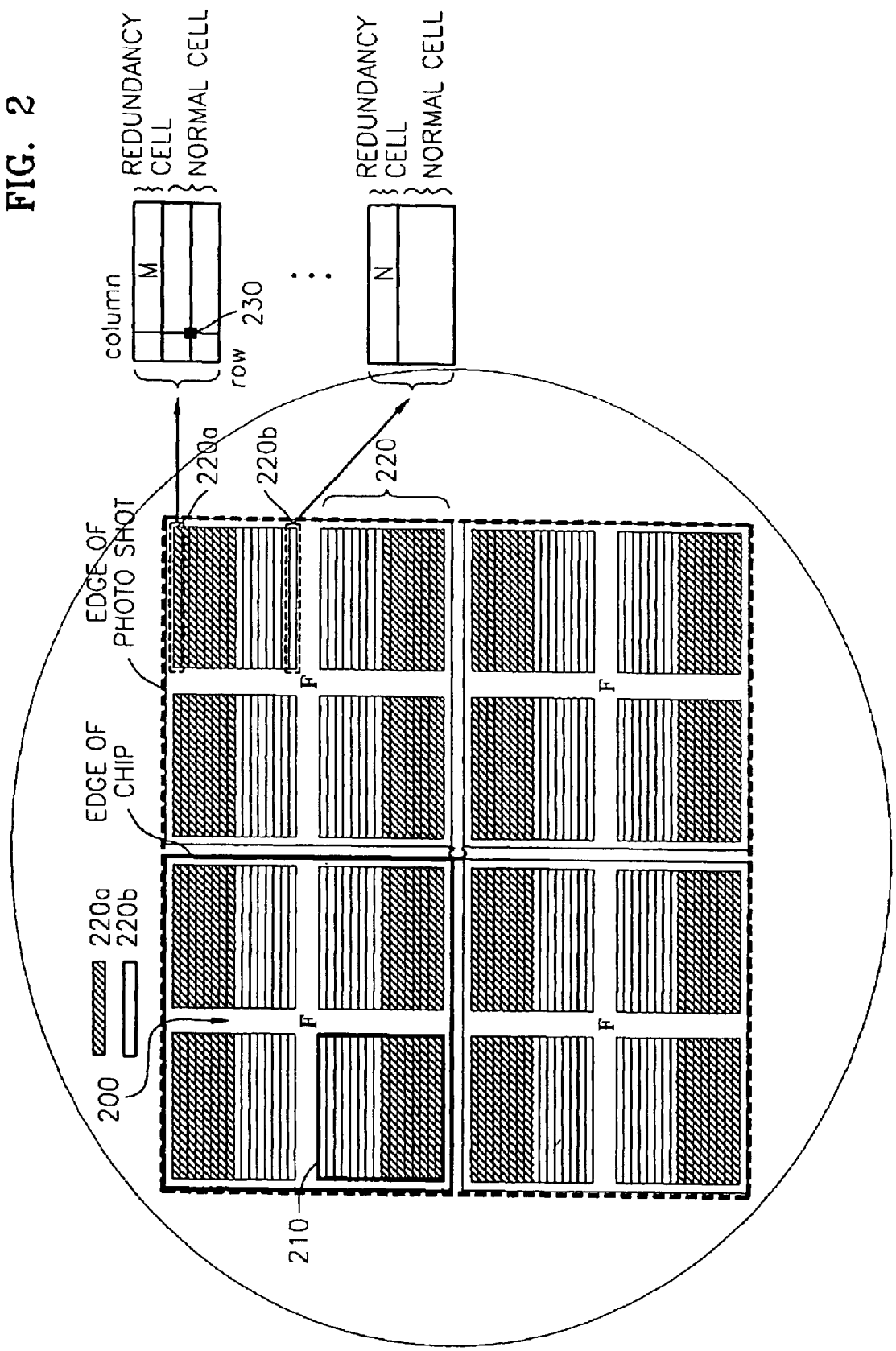
FIG. 2 is a diagram of a semiconductor wafer in which a plurality of semiconductor memory devices having improved redundancy schemes are aligned, according to one embodiment of the present invention.

FIG. 2 is a diagram of a semiconductor wafer in which a plurality of semiconductor memory devices having improved redundancy schemes, according to one embodiment of the present invention, are illustrated. Referring to FIG. 2, four semiconductor memory devices, which are basic units of a photo shot process, are illustrated in the semiconductor wafer.

A semiconductor memory device 200 according to an embodiment of the present invention includes at least one memory block 210. The memory block 210 includes a plurality of memory banks 220. In this embodiment, the memory block 210 is illustrated to have sixteen memory banks 220.

Figure 3:
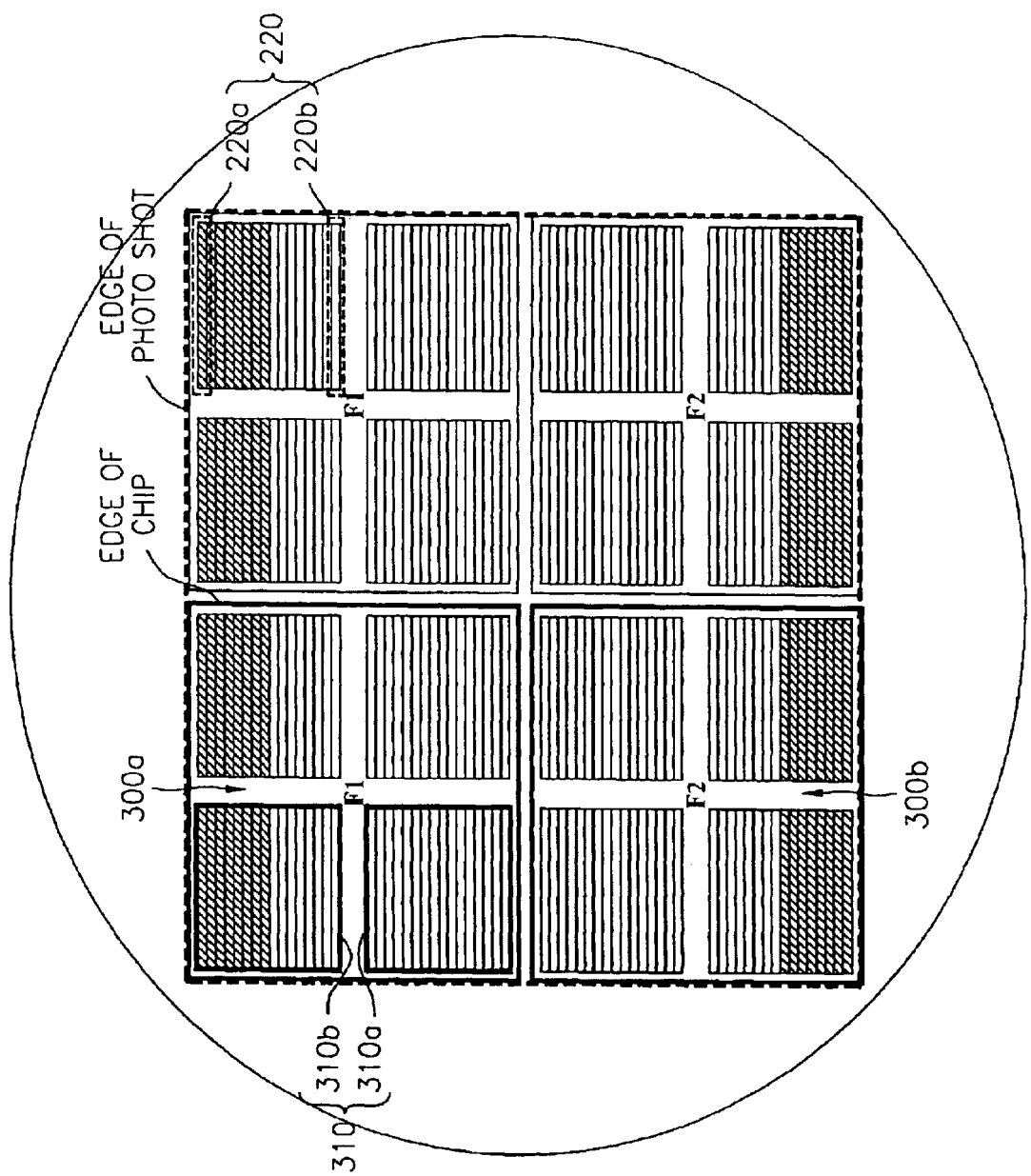
FIG. 3 is a diagram of a semiconductor wafer in which a plurality of semiconductor memory devices having improved redundancy schemes are aligned, according to another embodiment of the present invention.

In FIGS. 2 and 3, two types of memory bank 220a and 220b are illustrated. In detail, memory banks 220a and 220b denote a memory bank having M redundancy rows and a memory bank having N redundancy rows, respectively. Each memory block 210 includes eight memory banks 220A and eight memory banks 220b. Here, N is a natural number more than 1 and M is a natural number that is larger than N.

Each memory bank 220 includes a plurality of normal memory cells 230, which are arranged in a structure of row and column matrix, and at least one redundancy memory cell to replace a defective memory cell.

According to the present invention, if a defective memory cell is included in a memory bank 220, the defective memory cell is repaired using a repair process of replacing a line (hereinafter, 'defective line') including the defective memory cell with a redundancy line. The redundancy line may be a redundancy row or a redundancy column. However, in the repair process according to this embodiment, a defective line is replaced with a redundancy line that is a redundancy row. The present invention is not limited to the above description, and therefore, a column redundancy process of replacing a column line including a defective line with a redundancy column may be used to repair a defective memory cell.

One memory block 210 includes sixteen memory banks which are arranged in a column direction. Among these memory banks, memory banks adjacent to an edge of a chip include more redundancy lines than the other memory banks in the memory block 210. The edge of chip indicates a borderline of four sides encircling the four sides of one semiconductor memory device 200 as shown in FIG. 2.

In this embodiment, the eight memory banks 220a of sixteen memory banks 220, which constitute one memory block 210, adjacent to an edge of chip in a row direction include M redundancy rows. The other eight memory banks 220b of the sixteen memory banks 220, which are not adjacent to the edge of chip in the row direction, includes N redundancy rows.

According to the photo shot process, redundancy memory cells of memory banks adjacent to an edge of a photo shot are increased. The edge of a photo shot indicates a border line of four sides encircling the four sides of four semiconductor memory devices 200, which are units of the photo shot process, as shown in FIG. 2. There is no need to increase the number of redundancy memory cells of memory banks adjacent to an edge of chip at a photo shot center C. However, for ease of fabricating a photo mask, the number of redundancy memory cells of memory banks adjacent to the edge of chip at the photo shot center C are increased in this embodiment. This is possible because one chip data F is required to make a photo mask. That is, the same chip data F is shifted and arranged to make a photo mask, and thus, the number of redundancy memory cells of memory banks at an edge of chip at the photo shot center C must be increased.

In the semiconductor memory device 200 according to an embodiment of the present invention, the number M of redundancy memory cells of eight memory banks 220a adjacent to the edge of chip is larger than the number of redundancy memory cells of conventional memory banks, but the number N of redundancy memory cells of the other eight memory banks 220b is smaller than the number of redundancy memory cells in the conventional memory banks. As a result, a total number of redundancy memory cells included in one semiconductor memory device according to the present invention is almost the same as that of redundancy memory cells in a conventional semiconductor memory device. According to the present invention, it is possible to increase the efficiency of redundancy repair without changing the size of a chip of the semiconductor memory device.

FIG. 3 is a diagram of a semiconductor wafer in which a plurality of semiconductor memory devices are arranged, according to another embodiment of the present invention. As in the one embodiment of the present invention, it is assumed that the photo shot process is performed on the semiconductor wafer of FIG. 3 in units of four semiconductor memory devices. Thus, the semiconductor wafer of FIG. 3 is illustrated to have four semiconductor memory devices that are units of the photo shot process.

Similarly, in the semiconductor memory device 200 according to one embodiment of the present invention, a semiconductor memory device 300 according to another embodiment of the present invention includes four memory blocks 310. Each memory block 310 includes sixteen memory banks 220.

In FIG. 3, two types of semiconductor memory device 300a and 300b are illustrated. Each semiconductor memory device 300a has a pattern F1 and each semiconductor memory device 300b has a pattern F2. Each memory block 310a includes sixteen memory banks 220b of N redundancy rows, and each memory block 310b includes memory banks 220a of M redundancy rows and memory banks 220b of N redundancy rows.

One memory block 310 includes sixteen memory banks that are arranged in a column direction. Among these memory banks, memory banks adjacent to an edge of a photo shot have more redundancy lines than the other memory banks.

In this embodiment, M redundancy rows are included in eight memory banks 220a, adjacent to an edge of photo shot, out of sixteen memory banks which constitute the memory blocks 310b adjacent to an edge of photo shot in a row direction. N redundancy rows are included in the other eight memory banks 220b, which are not adjacent to the edge of photo shot in a row direction, out of sixteen memory banks constituting the memory block 310b. Also, N redundancy rows are included in all of the memory banks 220b of the memory block 310a, not adjacent to the edge of photo shot in the row direction.

In the semiconductor memory device 300 according to another embodiment of the present invention, only the number of redundancy memory cells of memory banks adjacent to the edge of photo shot is increased and the number of redundancy memory cells at a photo shot center C is not increased. Therefore, chip size of the semiconductor memory device 300 according to another embodiment of the present invention is smaller than that of the semiconductor memory device 200 according to one embodiment of the present invention.

According to another embodiment of the present invention, two types of chip data F1 and F2 are used in fabricating a photo mask. In detail, the chip data F1 in which the number of redundancy memory cells of memory banks at an upper part of the semiconductor memory device 300 is increased, and the chip data F2 in which the number of redundancy memory cells of memory banks at a lower part of the semiconductor memory device 300 is increased, are arranged as shown in FIG. 3. Therefore, a semiconductor wafer shown in FIG. 3 has a redundancy scheme in which the number of only redundancy memory cells of memory banks adjacent to an edge of photo shot where a rate of defective memory cells is higher is increased to raise the redundancy efficiency.

This disclosure describes that the number of redundancy memory cells of memory banks adjacent to an edge of photo shot or edge of chip in a row direction, is set to be larger than the number of redundancy memory cells of the other memory banks. However, according to the present invention, the number of redundancy memory cells of memory banks adjacent to an edge of photo shot and edge of chip in a column direction may be controlled to increase the redundancy efficiency.

Also, according to the present invention, the number of redundancy memory cells of memory banks at an edge of photo shot is set to be larger than that of redundancy memory cells of the other memory banks, in order to prevent shortage of redundancy memory cells due to a high repair rate of defective memory cells of memory banks at an edge of photo shot due to an insufficient photo margin in a photo shot process. However, in the event that a repair rate of defective memory cells in each memory bank is different in a process other than the photo shot process, redundancy efficiency can be increased to increase the number of redundancy memory cells of a memory bank where a repair rate of defective memory cells is higher.

While this invention has been particularly shown and described with reference to preferred embodiments thereof, it will be understood by those skilled in the art that various changes in form and details may be made therein without departing from the spirit and scope of the invention as defined by the appended claims.

As described above, according to the present invention, when defective proportions in memory banks are different, it is possible to increase yield by setting the number of redundancy memory cells included in each memory bank to be different, in general. Also, the number of redundancy memory cells of memory banks having more defective memory cells is increased and the number of redundancy memory cells of memory banks having less defective memory cells is decreased, thereby increasing redundancy flexibility without increasing the chip size.

What is claimed is:

1. A semiconductor memory device with an improved redundancy scheme, comprising a plurality of memory banks,
   wherein each of the plurality of memory banks comprises:
   normal memory cells arranged according to a row and column matrix structure; and
   at least one redundancy line to be replaced with a defective line,
   wherein the defective line is replaced with a redundancy line of a memory bank to which the defective line belongs, and the number of the redundancy line is set to be different according to the position of a memory bank including the redundancy line.

2. The semiconductor memory device of claim 1, wherein at least one memory bank, adjacent to an edge of photo shot, among the memory banks includes M redundancy lines and each of the other memory banks includes N redundancy lines (N is a natural number more than 1),
   wherein M is a natural number that is larger than N.

3. The semiconductor memory device of claim 1, wherein at least one memory bank, adjacent to an edge of chip, among the memory banks includes M redundancy lines and each of the other memory banks includes N redundancy lines (N is a natural number more than 1),
   wherein M is a natural number that is larger than N.

4. The semiconductor memory device of claim 1, wherein a row redundancy method is adopted.

5. The semiconductor memory device of claim 1, wherein a column redundancy method is adopted.

6. A semiconductor memory device with an improved redundancy scheme, comprising at least one memory block including a plurality of memory banks arranged in a column direction,
   wherein each of the plurality of memory banks comprises:
   a plurality of normal memory cells that are arranged according to a row and column structure; and
   at least one redundancy line to be replaced with a defective memory cell,
   wherein at least one memory bank, adjacent to an edge, among the plurality of memory banks, includes more redundancy lines than the other memory banks.

7. The semiconductor memory device of claim 6, wherein the edge indicates an edge of photo shot, and
   at least one memory bank, adjacent to the edge of photo shot, among the plurality of memory banks includes M redundancy lines and the other memory banks includes N redundancy lines (N is a natural number more than 1),
   wherein M is a natural number that is larger than N.

8. The semiconductor memory device of claim 6, wherein the edge indicates an edge of chip, and
   at least one memory bank, adjacent to the edge of chip, among the memory banks includes M redundancy lines and the other memory banks includes N redundancy lines (N is a natural number more than 1),
   wherein M is a natural number that is larger than N.

9. The semiconductor memory device of claim 6, wherein a row redundancy method is adopted.

10. The semiconductor memory device of claim 6, wherein a column redundancy method is adopted.

* * * * *